United States Patent

Bennett et al.

[11] Patent Number: 5,504,448
[45] Date of Patent: Apr. 2, 1996

[54] CURRENT LIMIT SENSE CIRCUIT AND METHOD FOR CONTROLLING A TRANSISTOR

[75] Inventors: Paul T. Bennett, Phoenix; Robert P. Dixon, Chandler, both of Ariz.

[73] Assignee: Motorola, Inc., Schaumburg, Ill.

[21] Appl. No.: 283,929

[22] Filed: Aug. 1, 1994

[51] Int. Cl.⁶ .................................................. H03K 17/16
[52] U.S. Cl. ............................................ 327/379; 327/365
[58] Field of Search ..................................... 323/311, 312, 323/315, 316, 317; 327/108, 109, 110, 362, 379, 380, 381, 427, 432

[56] References Cited

U.S. PATENT DOCUMENTS

| | | | |
|---|---|---|---|
| 4,275,701 | 6/1981 | Arguello et al. | 123/609 |
| 4,567,537 | 1/1986 | Kalkhof et al. | 323/312 |
| 5,027,004 | 6/1991 | Palara | 323/315 |
| 5,032,774 | 7/1991 | Juzswik | 318/293 |
| 5,175,489 | 12/1992 | Mizvide | 323/312 |
| 5,347,169 | 9/1994 | Preslar et al. | 307/246 |

*Primary Examiner*—Timothy P. Callahan
*Assistant Examiner*—Jeffrey Zweizig
*Attorney, Agent, or Firm*—Rennie William Dover

[57] ABSTRACT

A current limit circuit (10/40) for controlling a power transistor (12) has been provided. The current limit circuit includes circuitry which is responsive to a voltage appearing across the drain and source electrodes of the power transistor for providing an appropriate voltage at the gate electrode of the power transistor when a load is de-coupled from the power transistor. This has the effect of preventing excessive transient current when the load is subsequently coupled to the power transistor. Additionally, the current limit circuit includes circuitry for limiting the current flowing through the power transistor via a sense circuit when the load is coupled to the power transistor.

9 Claims, 2 Drawing Sheets

CURRENT LIMIT SENSE CIRCUIT AND METHOD FOR CONTROLLING A TRANSISTOR

FIELD OF THE INVENTION

This invention relates, in general, to power transistors and, in particular, to a current limit circuit for a power transistor.

BACKGROUND OF THE INVENTION

Power transistors are utilized in a myriad of applications such as in the automotive industry wherein one current carrying electrode of the power transistor may be coupled to an ignition voltage while the other current carrying electrode of the power transistor is coupled to a load that may be intermittently connected thereto.

When a load is connected to the power transistor, current flowing through the power transistor can be sensed by detecting a voltage across a sense resistor that is coupled in series with the power transistor. The drive to the gate electrode of the power transistor can then be adjusted accordingly to control the current. For example, if the voltage across the sense resistor exceeds a predetermined voltage, then the drive to the gate electrode of the power transistor can be reduced.

However, when the load is disconnected from the power transistor, prior art circuitry allows the voltage appearing at the gate electrode of the power transistor to rise to the supply voltage. As a result, when the load is subsequently connected, the power transistor is fully enhanced and a large peak overshoot current flows through the power transistor. This typically results in poor transient performance and may be unacceptable.

Hence, there exists a need for an improved current limit circuit for limiting large peak overshoot current flowing through a power transistor.

DETAILED DESCRIPTION OF THE DRAWINGS

Figure 1:
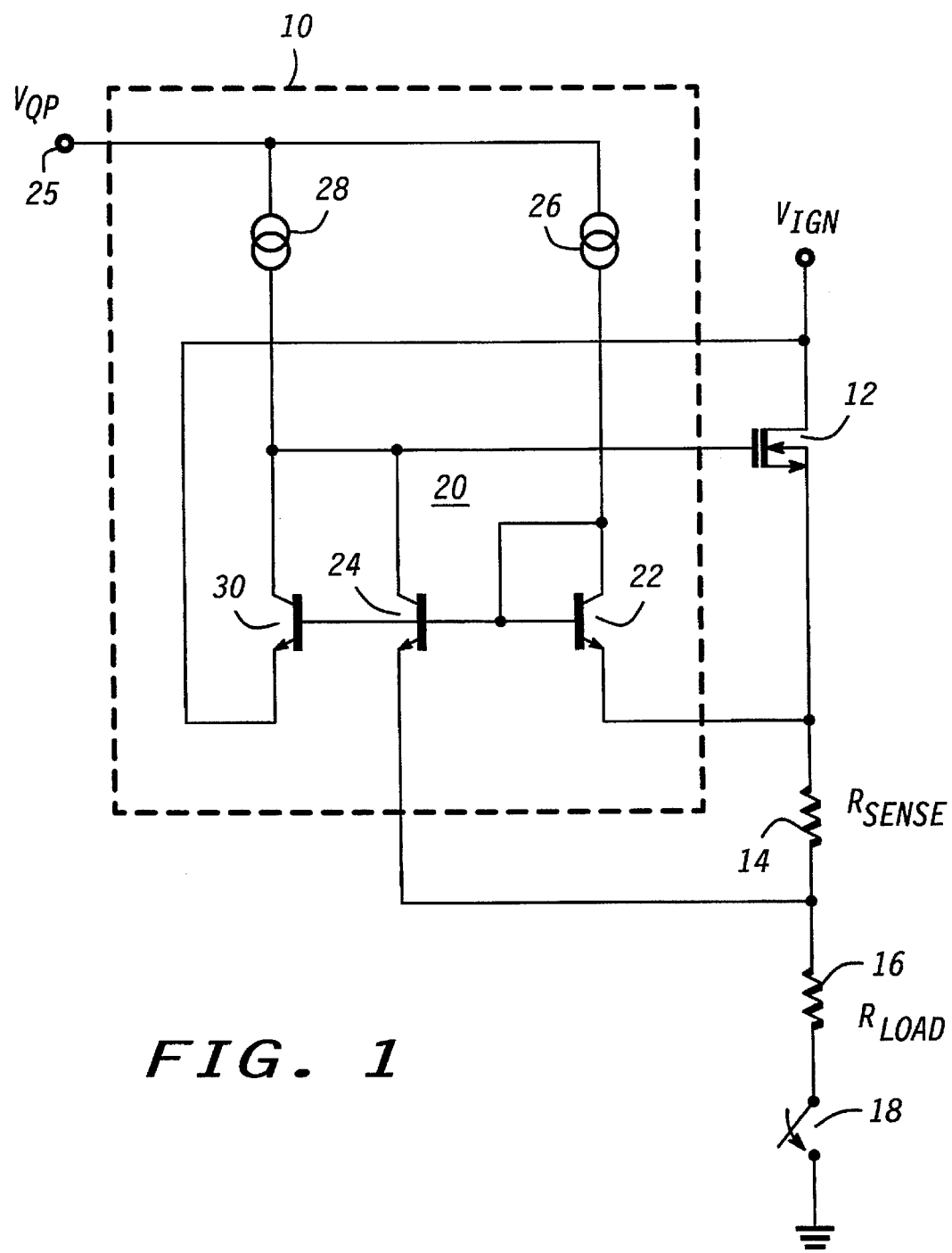
FIG. 1 is a detailed schematic diagram illustrating a current limit circuit for controlling a power transistor in accordance with the present invention.

Referring to FIG. 1, there is illustrated current limit circuit 10 for controlling power transistor 12. Power transistor 12 has a drain electrode coupled to receive an ignition voltage, $V_{IGN}$. Further, the source electrode of power transistor 12 is coupled through sense resistor 14 to a load as denoted by resistor 16 ($R_{LOAD}$). Additionally, load resistor 16 is coupled through switch 18 and returned to ground reference wherein switch 18 alternately couples and de-couples load 16 to power transistor 12.

Current limit circuit 10 includes current mirror 20 which is comprised of transistors 22 and 24. Transistor 22 has a collector coupled through current source 26 to terminal 25 for receiving a voltage, for example, a charge pump voltage as denoted by voltage $V_{QP}$. Similarly, the collector of transistor 24 is coupled through current source 28 to terminal 25. The base of transistor 22 is coupled to the collector of transistor 22 and to the base of transistor 24. The emitters of transistors 22 and 24 are coupled across sense resistor 14 ($R_{SENSE}$).

Transistor 30 has a collector coupled to the collector of transistor 24 and to the gate electrode of power transistor 12. The base of transistor 30 is coupled to the base of transistor 24 while the emitter of transistor 30 is coupled to the drain electrode of power transistor 12.

The circuit in FIG. 1 is described in each of three operating phases: gate held off, gate charged and switch 18 closed, gate charged and switch 18 open. The ignition voltage, VIGN, is coupled to a potential of 12 to 16 volts when the automobile's motor is running. The gate is held off by reducing the charge pump supply VQP to zero volts and discharging the gate voltage of power transistor 12 by sinking current through current source 28 to node 25. When the gate of power transistor 12 is held less than a threshold voltage above ground, the power transistor does not conduct current even if switch 18 is closed.

The gate is enabled whenever the charge pump voltage is brought high and current sources 26 and 28 source current from node 25. The charge pump voltage is typically pumped 10 to 15 volts above the ignition voltage VIGN and the voltage at the gate of power transistor 12 is clamped 10 to 15 volts above its source terminal to prevent gate to source breakdown. When the gate is brought 10 volts above its source the transistor is fully enhanced and acts as a switch (close to a dead short). Note that the current sources 26 and 28 are switchable on and off, and current source 28 may sink or source current.

When the switch 18 is closed and the gate is enabled, the gate begins charging through current source 28 and current begins flowing through power transistor 12. Typically current source 28 is 8–10 times larger than current source 26 and transistors 24 and 22 are equally matched in size and performance. As the current in the power transistor rises, the current through the load resistor 16 and the sense resistor 14 rises and the voltage at the emitter of transistor 22 rises above the voltage at the emitter of transistor 24. When the current flowing through the sense resistor causes a sufficient differential voltage across the emitters of transistors 22 and 24, transistor 24 begins conducting current thereby regulating the gate voltage of the power transistor 12. For the typical case, the load current is regulated by the ratio of 54 mV and the sense resistor of 27 mOhms, or approximately 2 amperes independent of the load resistance 16. Thus a means for charging the gate, current source 28, and a means for regulating the current through the load resistor 16, current source 26 and transistors 22 and 24, have been described.

When the gate is charged and the load 16 or switch 18 is momentarily opened, the voltage across sense resistor 14 drops to zero and transistor 24 no longer regulates the gate of the power transistor. If the gate of the power transistor rises up 10 to 15 volts above the source, then the power transistor is fully enhanced. If the power transistor is fully enhanced and switch 18 is closed, then a large transient current flows through the load 16 until transistor 24 can discharge the gate voltage to the proper regulation voltage. The transient current does not flow in the invention because transistor 30 prevents the power transistor from becoming fully enhanced.

When the gate is charged and the switch 18 is momentarily opened, the voltage at the source of power transistor 12 rises up nearly equal to the drain voltage and the power transistor enters saturation. Typically transistor 30 is 16 times larger than transistor 22. When the voltage at the source of the power transistor 12 rises close to its drain voltage (within 22 mV typically), transistor 30 begins regulating the gate voltage of the power transistor 12. The gate voltage of power transistor 12 is regulated a threshold voltage above its source voltage and thus remains nearly off. When the switch 18 is reclosed and the gate is charged, the current through the load rises quickly up to the regulated value and does not overshoot the current limit. Thus a means for regulating the voltage across the source and drain of the power transistor 12 has been demonstrated.

It should be noted that the sense resistor and/or the power transistor can be integrated with the current controlling circuit and typically the sense resistor is integrated.

Figure 2:
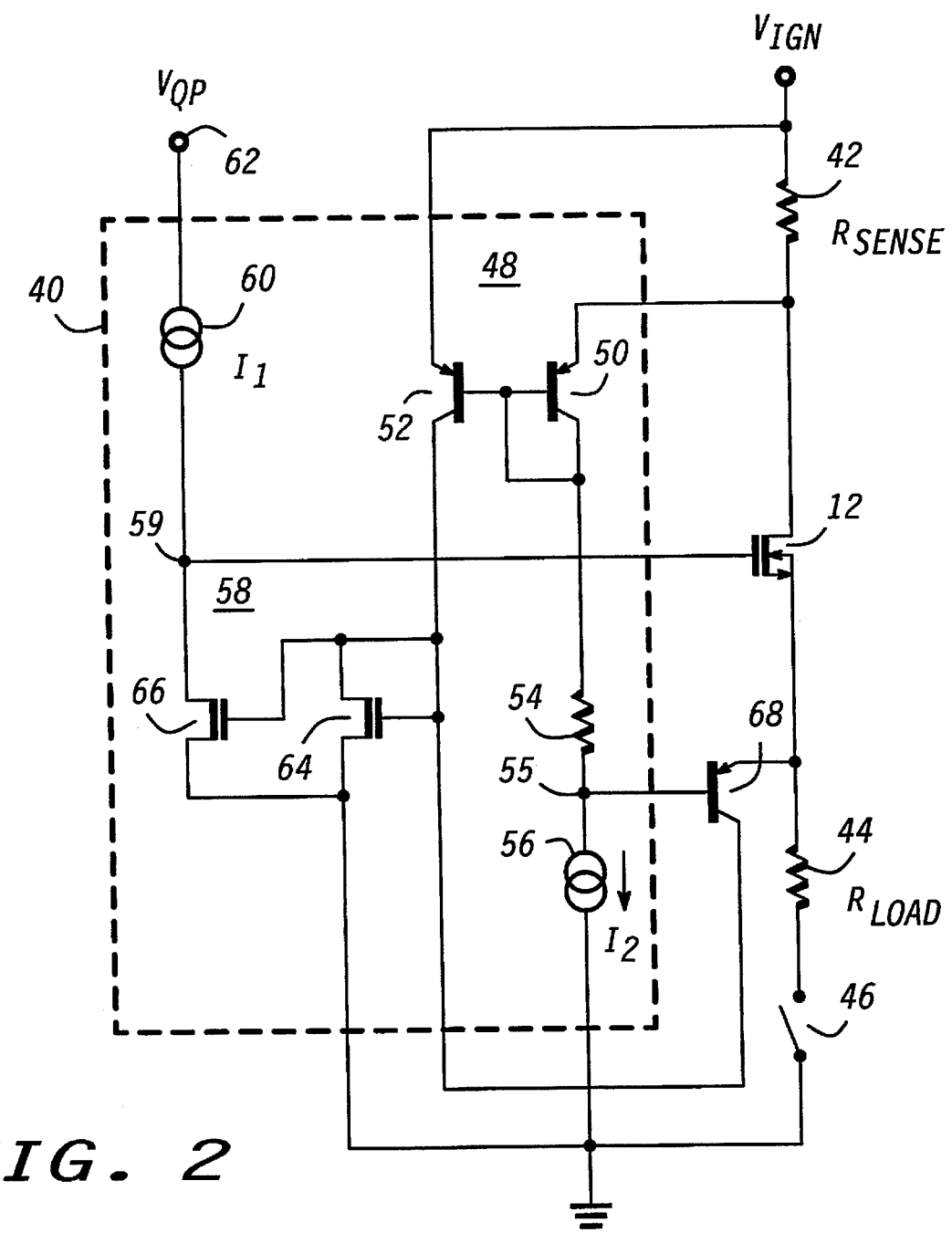
FIG. 2 is a detailed schematic diagram illustrating an alternate embodiment of a current limit circuit for controlling a power transistor in accordance with the present invention.

Referring to FIG. 2, there is illustrated current limit circuit 40 for controlling power transistor 12. Power transistor 12 has a drain electrode coupled through sense resistor 42 to receive an ignition voltage $V_{IGN}$. The source electrode of power transistor 12 is coupled to load 44 wherein load 44 is returned to ground through switch 46.

Current sense circuit 40 includes current mirror 48 which includes transistors 50 and 52. The collector of transistor 50 is coupled through resistor 54 to circuit node 55. Circuit node 55 is coupled through current source 56 and returned to ground. The collector of transistor 52 is coupled through current mirror 58 to circuit node 59. Circuit node 59 is coupled through current source 60 to terminal 62 at which charge voltage $V_{QP}$ is applied. Circuit node 59, which is the output of current mirror 58 is coupled to the gate electrode of power transistor 12.

The base of transistor 50 is coupled to the collector of transistor 50 and to the base of transistor 52. The emitters of transistors 50 and 52 are coupled across sense resistor 42.

Current mirror 58 includes transistors 64 and 66 each having a source electrode returned to ground. The gate electrode of transistor 64 (which represents the input of current mirror 58) is coupled to the collector of transistor 52. Additionally, the gate electrode of transistor 64 is coupled to the drain electrode of transistor 64 and to the gate electrode of transistor 66. The drain electrode of transistor 66 is coupled to circuit node 59.

Transistor 68 has a collector coupled to the gate electrode of transistor 64 and a base coupled to circuit node 55. Also, the emitter of transistor 68 is coupled to the source electrode of power transistor 12.

In FIG. 2, please note that the sense resistor 42 is located at the drain side of the power transistor 12. Transistors 50, 52 and 68 in FIG. 2 act in the same way as transistors 22, 24 and 30 in FIG. 1, respectively. Current sources 56 and 60 act in the same way as current sources 26 and 28, respectively. The sense resistor 42, load resistor 44 and continuity switch 46 act in the same way as sense resistor 14, load resistor 16, and switch 18, respectively.

The gate is discharged by reducing the charge pump voltage VQP to zero as before and sinking current through current source 60 to node 62 thus bringing the voltage at the gate nearly equal to zero.

When the gate is enabled, the charge pump VQP is brought high and the gate charges up through current source 60. Note that the current sources 56 and 60 are switchable on and off, and current source 60 may sink or source current. Thus, as before, a means for charging the gate has been provided.

When the gate is enabled and the switch 46 is closed, the gate voltage of the power transistor 12 rises and current through the load 44 and sense resistor 42 rises. As the current in the sense resistor 42 rises, the voltage at the emitter of transistor 52 rises above the emitter voltage of transistor 50. When the differential voltage across the emitters of transistors 50 and 52 is great enough, the transistor 52 begins conducting sufficient current to pull down current through current mirror 58 equal to the current through current source 60 and regulates the gate voltage at the power transistor 12. The load current is thus regulated. The natural log of the ratio of the current of current sources 56 and 60 and the current mirror 58 times the constant kt/q divided by the sense resistor determine the value of the current regulation. Thus a means of regulating the current has been provided.

When the gate is enabled and the switch 46 is open, the gate charges until transistor 68 regulates the drain to source voltage of the power transistor 12. The voltage at the emitter of transistor 68 rises up when the load is disconnected and the gate is enabled. Transistor 68 begins conducting and pulls down current through mirror 58 equal to the source current 60. The gate voltage of the power transistor regulates to a threshold voltage above its source and the power transistor is nearly off. As before, when the switch 46 closes, the current quickly rises up to the limit but does not overshoot during transient switching. Note that the voltage at the base of transistor 68 is offset from the voltage at the base of transistor 50 by the current flowing through resistor 54. Thus the saturation voltage across the power transistor may be adjusted by determining when transistor 68 is turned on. Further note that transistor 68 may be of equal size to transistors 50 and 52. It should also be noted that resistor 54 may be replaced with a diode or other similar means for determining a voltage drop. Thus a means for regulating the voltage across the power transistor's source and drain has been demonstrated. Another means for setting the voltage level at the emitter of transistor 68 would be to reduce resistor 54 to a short and hooking the collector of transistor 68 to a separate current mirror (not shown) connected to node 59 and of substantially different ratio than that of current mirror 58.

The current mirror 58 is a standard MOS implementation of a current mirror. Current into the drain of transistor 64 produces a gate voltage at the gate electrodes of transistors 64 and 66. The gate voltage at transistor 66 determines the drain current through transistor 66. If equal sized transistors are used for transistors 64 and 66, then the current into the mirror will equal the current out of the mirror. A current ratio out of the mirror different than the current into the mirror may be generated by sizing the transistors 64 and 66 differently. It should be noted that a bipolar mirror could perform the same function.

By now it should be apparent from the foregoing discussion that a novel current limit circuit for controlling a power transistor has been provided. The current limit circuit includes circuitry which is responsive to a voltage appearing across the drain and source electrodes of the power transistor for providing an appropriate voltage at the gate electrode of the power transistor when a load is de-coupled from the power transistor. This has the effect of preventing excessive transient current when the load is subsequently coupled to the power transistor. Additionally, the current limit circuit includes circuitry for limiting the current flowing through the power transistor via a sense circuit when the load is coupled to the power transistor.

While the invention has been described in specific embodiments thereof, it is evident that many alterations, modifications and variations will be apparent to those skilled in the art. Accordingly, it is intended to embrace all such alterations, modifications and variations in the appended claims.

We claim:

1. A current limit sense circuit for controlling a power transistor having first, second and control electrodes, the power transistor coupled to a sensing circuit for detecting a current through the power transistor, the power transistor alternately coupled and de-coupled to a load, the current limit sense circuit comprising:

a first circuit for providing drive to the power transistor, said first circuit coupled to the control electrode of the power transistor;

a second circuit coupled across the sense circuit for limiting the current flowing through the power transistor, said second circuit coupled to the control electrode of the power transistor; and a third circuit for regulating a voltage at the control electrode of the power transistor in accordance with a voltage between the first and second electrodes of the power transistor when the load is de-coupled from the power transistor, said third circuit coupled to said second circuit and to the power transistor.

2. The current limit sense circuit according to claim 1 wherein said third circuit includes a first transistor having a collector, a base and an emitter, said collector of said first transistor coupled to the control electrode of the power transistor, said base of said first transistor coupled to said second circuit, and said emitter of said first transistor coupled to the first electrode of the power transistor.

3. The current limit sense circuit according to claim 1 wherein said second circuit includes:

a first transistor having a collector, a base and an emitter, said collector coupled to said base of said first transistor;

a second transistor having a collector, a base and an emitter, said collector of said second transistor coupled to said first circuit, said base of said second transistor coupled to said base of said first transistor and to said third circuit, said emitters of said first and second transistors coupled across the sensing circuit; and a current source coupled between a voltage terminal and said collector of said first transistor.

4. The current limit sense circuit according to claim 1 wherein said first circuit includes a current source coupled between a voltage terminal and the control electrode of the power transistor.

5. The current limit sense circuit according to claim 1 further including a current mirror circuit having an input and an output, said input of said current mirror circuit coupled to said second circuit, said output of said current mirror circuit coupled to the control electrode of the power transistor.

6. A current limit sense circuit for controlling a power transistor having first, second and control electrodes, the power transistor coupled to a sensing circuit for detecting a current through the power transistor, the power transistor alternately coupled and de-coupled to a load, the current limit sense circuit comprising:

a first transistor having a collector, a base and an emitter, said collector of said first transistor coupled to said base of said first transistor;

a second transistor having a collector, a base and an emitter, said collector of said second transistor coupled to the control electrode of the power transistor, said base of said second transistor coupled to said base of said first transistor, said emitters of said first and second transistors coupled across the sensing circuit;

a third transistor having a collector, a base and an emitter, said collector of said third transistor coupled to the control electrode of the power transistor, said base of said third transistor coupled to said base of said first transistor, said emitter of said third transistor coupled to the first electrode of the power transistor;

a first current source coupled between a first terminal and said collector of said second transistor; and a second current source coupled between said first terminal and said collector of said first transistor.

7. A current limit sense circuit for controlling a power transistor having first, second and control electrodes, the power transistor coupled to a sensing circuit for detecting a current through the power transistor, the power transistor alternately coupled and de-coupled to a load, the current limit sense circuit comprising:

a first transistor having a collector, a base and an emitter, said collector of said first transistor coupled to said base of said first transistor;

a second transistor having a collector, a base and an emitter, said base of said second transistor coupled to said base of said first transistor, said emitters of said first and second transistors coupled across the sensing circuit;

a third transistor having a collector, a base and an emitter, said collector of said third transistor coupled to said collector of said second transistor, said base of said third transistor coupled to said collector of said first transistor, said emitter of said third transistor coupled to the power transistor;

a current mirror circuit having an input and an output, said input of said current mirror circuit coupled to said collector of said second transistor, said output of said current mirror coupled to the control electrode of the power transistor;

a first current source coupled between a first terminal and the control electrode of the power transistor; and a second current source coupled between said base of said third transistor and a second terminal.

8. The current limit sense circuit according to claim 7 further including a resistor coupled between said collector of said first transistor and said base of said third transistor.

9. A method for controlling a power transistor having first, second and control electrodes, the power transistor being alternately coupled to and de-coupled from a load, the method comprising the steps of:

providing drive to the control electrode of the power transistor for turning on the power transistor;

limiting a current though the power transistor when the load is coupled to the power transistor; and controlling a voltage at the control electrode of the power transistor in response to a voltage appearing between the first and second electrodes of the power transistor when the load is de-coupled from the power transistor thereby preventing excessive transient current when the load is subsequently coupled to the power transistor.

* * * * *